United States Patent [19]

Gotoh et al.

[11] Patent Number: 4,713,276
[45] Date of Patent: Dec. 15, 1987

[54] PAPER-LIKE PRODUCT, METHOD AND APPARATUS FOR PRODUCTION THEREOF AND PREPREG FORMED OF SAID PAPER-LIKE PRODUCT

[75] Inventors: Hajime Gotoh; Mamoru Machida; Osamu Sugiyama, all of Nagoya, Japan

[73] Assignee: Mitsubishi Rayon Co., Ltd., Tokyo, Japan

[21] Appl. No.: 713,987

[22] Filed: Mar. 20, 1985

[30] Foreign Application Priority Data

| Mar. 21, 1984 [JP] | Japan | 59-53788 |
| Jun. 28, 1984 [JP] | Japan | 59-133551 |
| Oct. 19, 1984 [JP] | Japan | 59-220070 |
| Nov. 1, 1984 [JP] | Japan | 59-230764 |
| Dec. 12, 1984 [JP] | Japan | 59-188385[U] |

[51] Int. Cl.$^4$ .......................... B21F 1/02; D21E 11/00; D21F 11/04
[52] U.S. Cl. .................................. 428/113; 162/152; 162/156; 162/325; 428/359; 428/361
[58] Field of Search ............... 428/113, 359, 360, 361; 162/152, 156, 325

[56] References Cited

U.S. PATENT DOCUMENTS

| 3,622,428 | 11/1971 | Robinson | 428/113 |
| 3,717,546 | 2/1973 | Jacquelin | 162/325 |
| 3,727,615 | 4/1973 | Duchane | 428/359 |
| 3,822,183 | 7/1974 | McKnight | 162/325 |
| 4,278,720 | 7/1981 | Duchane | 428/109 |

FOREIGN PATENT DOCUMENTS 564622 11/1932 Fed. Rep. of Germany ...... 162/325

Primary Examiner—John E. Kittle
Attorney, Agent, or Firm—Oblon, Fisher, Spivak, McClelland, & Maier

[57] ABSTRACT

A paper-like product composed of staple fibers oriented substantially in a certain specific direction is provided, wherein the orientation degree of the constituent staple fibers, expressed by the following formula:

$$\text{orientation degree (\%)} = \frac{\text{number of staple fibers oriented within } \pm 5° \text{ to specific direction}}{\text{total number of staple fibers in paper-like product}} \times 100$$

is at least 50%. A prepreg is formed by impregnating the paper-like product with a matrix resin. Composite prepregs are formed by laminating a plurality of such prepregs or such a prepreg with a prepreg composed of continuous filaments, in a manner such that the orientation directions of fibers in the prepregs intersect one another. The paper-like product is prepared by scattering a liquid dispersion of staple fibers in the horizontal direction by a centrifugal force, and collecting the scattered staple fibers in the form of a web on a collecting surface continuously moving in the vertical direction.

17 Claims, 16 Drawing Figures

PAPER-LIKE PRODUCT, METHOD AND APPARATUS FOR PRODUCTION THEREOF AND PREPREG FORMED OF SAID PAPER-LIKE PRODUCT

BACKGROUND OF THE INVENTION (1) Field of the Invention

The present invention relates to a paper-like product useful as a fiber reinforcement for fiber-reinforced plastics (hereinafter referred to as "FRP") and having a special structure, a prepreg formed by impregnating the paper-like product with a matrix resin, and a method and apparatus for the production of the paper-like product.

(2) Description of the Related Art

For the fiber orientation in FRP, it is preferred that the fibers be oriented in the direction of a force given to FRP or a stress produced in FRP. Accordingly, a material in which continuous filaments are arranged in one direction, that is, a unidirectional (UD) material, has been considered the best fiber reinforcement for FRP. This material is most preferred as a material for producing a feature that fibers are oriented in the direction of a stress produced in FRP. However, it is difficult to prepare a fiber reinforcement in the form of a thin sheet from this UD material with any economic advantage. More specifically, a filament strand used as a fiber reinforcement for FRP is generally thick in size, and it is very difficult to arrange filaments of this strand properly in one direction and spread the strand into a sheet form.

One necessary function of a fiber reinforcement in the form of a thin sheet is a reinforcing action in the direction perpendicular to the orientation direction in the UD material. For example, there can be mentioned a reinforcing action in the circumferential direction in a pipe-like product. In the case of a pipe-like product, for example, a fishing rod, a UD material is arranged so that its orientation direction is in agreement with the longitudinal direction, and in order to improve the flexural strength, fibers are also arranged properly in the circumferential direction, that is, in the direction at a right angle to the orientation direction of the UD material (hereinafter referred to as "90° reinforcement"). A small amount of fibers is sufficient for this 90° reinforcement, and generally, this amount is less than 10% of the amount of fibers arranged in the orientation direction of the UD material (hereinafter referred to as "0° reinforcement"), though this amount may be varied to some extent according to the desired end product.

Furthermore, a sheet material which is as thin as possible and has a good dimensional stability is desirable as a reinforcement for a base of a printed circuit board.

A paper-like product formed as an aggregate of staple fibers is a material suitable for obtaining a thin sheet-like product. However, in conventional paper-like products, fibers are oriented substantially isotropically, and in view of the above-mentioned conventional idea that fibers should be properly arranged in the direction of the stress produced, these paper-like products are not preferred.

The present inventors carried out research into the relationships of the fiber orientation in a paper-like product to the physical properties of FRP obtained by impregnating this paper-like product with a matrix resin. At first, carbon staple fibers having a diameter of 8 μm and a length of about 10 mm, as a typical example of the conventional fiber reinforcement, were dispersed at a concentration of 0.05% by weight in an aqueous 0.4% solution of carboxymethyl cellulose. The resulting dispersion (hereinafter referred to as "slurry") was stirred by a rotary vane. Various orientation states of carbon staple fibers in the slurry could be obtained by conducting stirring under various stirring conditions. In an enlarged photograph of paper obtained from these oriented staple fibers by the hand paper making method, the number of staple fibers oriented within ±5° to a predetermined direction was counted, and the ratio (%) of these staple fibers to all the staple fibers in the paper-like product was calculated as the "orientation degree". Namely, the orientation degree is expressed by the following formula:

$$\text{orientation degree (\%)} = \frac{\text{number of staple fibers oriented within } \pm 5° \text{ to specific direction}}{\text{total number of staple fibers in paper-like product}} \times 100$$

The obtained paper-like product was impregnated with about 150% by weight of an epoxy resin as a matrix resin and the resin was cured to obtain plate-like FRP reinforced with the paper-like product. The tensile strength ($T_0$) in a direction of orientation of the staple fibers and the tensile strength ($T_{90}$) in a direction perpendicular to the orientation direction were determined, and the ratio $T_0/T_{90}$ was calculated. The obtained results are shown in Table 1.

TABLE 1

| Orientation degree (%) | $T_0/T_{90}$ | Remarks |
|---|---|---|
| 6 | 1.2 | Substantially isotropic |
| 43 | 11.7 | |
| 63 | 19.3 | |
| 81 | 23.8 | |
| 90 | 25.4 | |
| 98 | 24.6 | Substantially unidirectionally oriented |

From the results shown in Table 1, it is seen that the orientation effect is prominent when the orientation degree is at least 50%. The orientation degree is preferably at least 60%, and more preferably, at least 80%. Namely, it has been confirmed that a paper-like product in which the content of staple fibers oriented in a specific direction is at least 50% is valuable as a reinforcement. This can be confirmed in not only carbon fibers but also in alumina fibers, glass fibers, and cellulose fibers. Moreover, this can be confirmed in paper-like products composed of whiskers and those composed of at least 2 kinds of staple fibers.

The above-mentioned paper-like product, that is, a paper-like product, especially a thin paper-like product having a basis weight of not more than 20 g/m² in which the content of staple fibers oriented in a specific direction is at least 50%, involves problems with respect to handling thereof.

When the fiber orientation direction is in agreement with the longitudinal direction of the paper-like product, handling of the paper-like product is relatively easy. However, in the case of a paper-like product in which the orientation direction is perpendicular to the longitudinal direction, handling must be carried out very carefully, because the paper-like product is readily broken by a very small force. This tendency is especially prominent in a paper-like product having a small basis weight, although the use of the thin paper-like product is advantageous. Accordingly, in a paper-like product having fibers oriented in a specific direction, one of the important problems is how to improve the strength in the direction perpendicular to the fiber orientation direction. Namely, there has been the technical problem of how to improve the strength in the direction perpendicular in the orientation direction with a small amount of fibers while orienting reinforcing fibers in a certain direction as much as possible. As means for solving this problem, there have been adopted a method in which the amount of an adhesive as a constituent of the paper-like product is increased or a method in which the same or different kinds of paper-like products are laminated so that their orientation directions are perpendicular to each other. The former method has a problem in that the adhesive has an adverse influence on the physical properties of the final product, especially the adhesion between the fiber and resin. The latter method has a problem in that a thin paper-like product cannot be obtained.

SUMMARY OF THE INVENTION

It is therefore a primary object of the present invention to provide a relatively thin paper-like product which is valuable as a fiber reinforcement for FRP.

In accordance with one fundamental aspect of the present invention, there is provided a paper-like product composed of staple fibers oriented substantially in a certain specific direction, wherein the orientation degree of the constituent staple fibers, expressed by the following formula:

$$\text{orientation degree (\%)} = \frac{\text{number of staple fibers oriented within } \pm 5° \text{ to specific direction}}{\text{total number of staple fibers in paper-like product}} \times 100$$

is at least 50%.

In accordance with another aspect of the present invention, there is provided a prepreg formed by impregnating the above-mentioned paper-like product with a resin.

In accordance with still another object of the present invention, there is provided a composite prepreg formed by laminating a plurality of prepregs as described above in such a manner that the orientation directions of staple fibers in the prepregs intersect one another.

In accordance with still another aspect of the present invention, there is provided a composite prepreg formed by laminating the above-mentioned prepreg with a prepreg composed of continuous filaments oriented substantially in a certain specific direction in such a manner that the orientation direction of the staple fibers and the orientation direction of the continuous filaments intersect.

In accordance with still another aspect of the present invention, there is provided a method for the production of a paper-like product, which comprises scattering a liquid containing staple fibers dispersed therein in the horizontal direction by a centrifugal force and collecting the scattered staple fibers in the form of a thin web sheet on a collecting surface continuously moving in the vertical direction.

In accordance with still another aspect of the present invention, there is provided an apparatus for the production of a paper-like product, which comprises a disk member rotating around the vertical axis, supply means for supplying a dispersion of staple fibers onto the disk member, and staple fiber collecting means arranged in close proximity to the periphery of the disk member and moving in the vertical direction.

In accordance with still another aspect of the present invention, there is provided an apparatus for the production of a paper-like product, which comprises two disk members rotating around the vertical axis and confronting each other, supply means for supplying a dispersion of staple fibers between the disk members, and staple fiber collecting means arranged in close proximity to the peripheries of the disk members and moving in the vertical direction.

In accordance with a further aspect of the present invention, there is provided an apparatus for the production of a paper-like product, which comprises a nozzle for jetting a dispersion of staple fibers, which is horizontally arranged and rotates around the vertical axis, supply means for supplying a dispersion of staple fibers to the nozzle, and staple fiber collecting means arranged in close proximity to the top end portion of the nozzle and moving in the vertical direction.

DETAILED DESCRIPTION OF THE PREFERRED EMBODIMENTS

The structure of the paper-like product of the present invention will now be described in detail with reference to the accompanying drawings.

Figure 1:
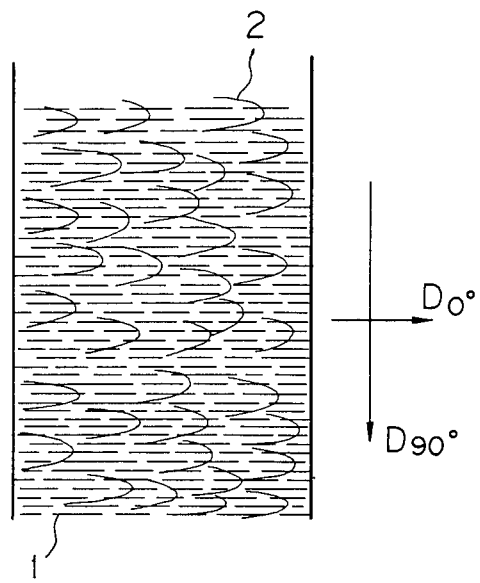
FIG. 1 is a diagram illustrating the orientation state of staple fibers constituting the paper-product of the present invention.

In FIG. 1 illustrating the paper-like product of the present invention, reference numeral 1 represents reinforcing staple fibers oriented substantially in a certain direction (hereinafter referred to as "oriented fibers"), and reference numeral 2 represents fibers which are preferably present in the product of the present invention (hereinafter referred to as "binder fibers").

Figure 2:
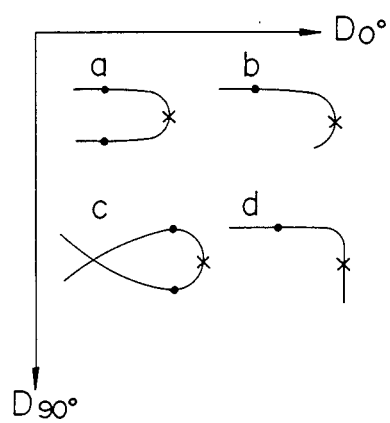
FIG. 2 is a diagram illustrating the states of respective staple fibers constituting the paper-like product of the present invention.

In FIG. 1, D90° represents the longitudinal direction of the paper-like product, and D0° represents the lateral direction thereof. Accordingly, the orientation direction of the oriented fibers is in agreement with the lateral direction D0° of the paper-like product. As typically shown by a through line d in FIG. 2, in the paper-like product of the present invention, the binder fibers 2 inevitably have portions parallel to D90° and D0° (indicated by marks X and ·, respectively), though the binder fibers 2 can take various shapes. In other words, the binder fibers can be defined as staple fibers having portions parallel and perpendicular to the oriented fibers.

The paper-like product of the present invention is composed of oriented fibers and optional binder fibers as defined above. However, since the product of the present invention is composed of staple fibers, it naturally contains minor amounts of staple fibers not included within the scope of oriented fibers or binder fibers. The binder fibers may be the same as or different from the oriented fibers in the fiber material, the fiber length, and the fineness.

In the paper-like product of the present invention, the reinforcing effect by the binder fibers is prominent when the basis weight of the paper-like product is relatively small. For example, where carbon fibers are used as the oriented fibers, the effect is prominent when the total basis weight of the paper-like product is not more than about 20 g/m². In a paper-like product having such a small basis weight, in order to obtain a sufficient reinforcing effect without substantial reduction of the physical properties in the direction D0°, it is preferred that the proportion of the binder fibers be at least about 1.5% by weight based on the total fibers. If this requirement is satisfied, a reinforcing effect in the direction D90°, which does not cause any handling problem, can be attained.

The reason why this high reinforcing effect in the direction 90° is attained because of the presence of a small amount of binder fibers is considered to be as follows.

In the paper-like product of the present invention, since the majority of staple fibers are oriented in a certain direction, cutting or breaking in the direction of 90° to the orientation direction appears as tearing in the direction D90°. Reinforcement in the direction D90° prevents occurrence of this tearing. Namely, if fibers exist arranged in the direction of 90° to the orientation direction D0°, tearing is stopped at these fibers, with the result that the strength in the direction D90° is improved and the handling property is enhanced.

The above-mentioned paper-like product of the present invention can be prepared, for example, according to the following method. A dispersion containing several % by weight of staple fibers is extruded while traversing a dispersion extrusion nozzle on the inner side of a rotating mesh drum. The liquid of the dispersion is expelled on the outer side of the mesh drum by a centrifugal force generated by rotation of the mesh drum while the staple fibers are oriented in the circumferential direction of the drum on the inner side of the drum, whereby a paper-like product comprising the thus oriented fibers is obtained. If, at this point, there is no turbulent flow in the extruded stream of the dispersion and the extruded stream is uniform, substantially all of the staple fibers are oriented in the circumferential direction. On the other hand, if a turbulent flow is produced in the extruded stream and the rotation speed of the drum is relatively low, binder fibers specifically observed in the structure of the paper-like product of the present invention are caused to appear.

The following method also may be adopted for the production of the paper-like product including the above-mentioned binder fibers. More specifically, a dispersion of staple fibers is extruded to the center of a rotary disk to scatter the dispersion (slurry) around the disk. If this scattered dispersion is collected on a screen moving while intersecting the plane including the disk, the structure of the paper-like product of the present invention can be produced.

The paper-like product of the present invention will now be described in detail with reference to the following examples.

EXAMPLE 1

Carbon fibers having a diameter of 8 μm and a length of about 10 mm were dispersed in an aqueous 0.4% solution of carboxymethyl cellulose. The amount of the carbon fibers was 0.1% by weight based on the aqueous solution. From this dispersion, a paper-like product of the present invention was prepared according to the above-mentioned latter method. Namely, the dispersion was dropped at the center of a rotary disk. The preparation apparatus used corresponded to that shown in FIG. 3, and the preparation conditions were as follows.

The above-mentioned dispersion (slurry) was sufficiently stirred in a dispersing vessel 3, and the dispersion was allowed to naturally drop at the center of a disk member 6 at a rate of 7 liters/min from a supply nozzle 5' having a diameter of 8 mm. The disk member 6 was a stainless steel disk having a flat surface and a diameter of 200 mm, which was rotated at 350 rpm.

The slurry was scattered in the circumferential direction of the disk member by a centrifugal force generated by rotation of the disk member 6. The periphery of the disk member 6 was substantially completely surrounded by two paper-forming meshes 13 of a plain weave texture of nylon monofilaments having a diameter of 0.2 mm, which were arranged 1.5 mm apart from the periphery of the disk member 6. Each mesh had a width of 318 mm and each of the warp and weft densities was 50 filaments per inch. A suction box having a slit 9 having a width of 3 mm was disposed at the back of each mesh, so that a subatmospheric pressure of −0.2 atmosphere was produced. Each paper-forming mesh 13 was moved at a rate of 1 m/min downward in FIG. 3.

The fibers of the slurry which had naturally fallen on the disk member were collected on the paper-forming mesh, and the liquid was separated together with air through the slit 9. The fibers on the mesh were dried to obtain a paper having a basis weight of about 7 g/m².

In order to examine the orientation state of the fibers in the thus-obtained paper, an enlarged photograph was taken. The number of binder fibers defined hereinbefore was counted. The ratio of the number of the binder fibers to the total fiber number was 3.5%. The tensile strength was 180 g/cm in the direction D0 and 1.5 g/cm in the direction D90°. This paper could be separated from the mesh 13 very easily, and the paper had sufficient strength and tearing was not caused during handling.

COMPARATIVE EXAMPLE 1

The same dispersion as used in Example 1 was extruded from an extrusion nozzle without causing a turbulent flow, and fibers were collected on the inner side of a mesh drum rotated at a peripheral speed higher than the extrusion speed according to the above-mentioned former method. Substantially all of the fibers were oriented in the circumferential direction of the drum, and an oriented paper free of binder fibers specifically observed in the paper-like product of the present invention was obtained. It was difficult to separate this paper from the mesh, and tearing was readily caused in the direction D0° only by a slight stress. Accordingly, it was confirmed that the paper could not be put into practical use.

EXAMPLE 2

A paper was prepared in the same manner as described in Comparative Example 1 except that the extruded stream was not completely rectified but a turbulent flow was formed in the extruded stream. The orientation state of the fibers was examined in the same manner as described in Example 1. The binder fibers as defined hereinbefore were observed, and the ratio of the number of the binder fibers to the total fiber number was 1.5%. The tensile strength of the paper was 198 g/cm in the direction D0° and 1.2 g/cm in the direction D90°. The paper could be separated from the mesh, though this was difficult to some extent.

As will be apparent from the foregoing description, in the paper-like product of the present invention, the handling property can be improved without reduction of the strength in the fiber orientation direction and this effect is attained by the presence of the above-mentioned binder fibers, and that a paper-like product having a very small basis weight can be advantageously provided according to the present invention.

A product obtained by impregnating the paper-like product of the present invention with a matrix resin in an amount of 30% to 200% by weight can be utilized as a paper prepreg material. Any thermoplastic and thermosetting resin can be used as the matrix resin. For example, there can be used nylons, polycarbonates, polybutylene terephthalate, polysulfones, polyethersulfones, polyether-ketones, polyamides, epoxy resins, phenolic resins, unsaturated polyesters, and vinyl ester resins. The impregnation method is not particularly critical. However, in view of the physical properties of the paper-like product, it is preferred that the film method be adopted.

Furthermore, according to the present invention, a composite prepreg which is reinforced in the direction of 90° in a unidirectional prepreg can be obtained by laminating the paper-like product of the present invention with a so-called unidirectional prepreg formed by unidirectionally orientated continuous filaments and impregnating the filaments with a matrix resin, so that the orientation direction of the paper-like product intersects the orientation direction of the unidirectional prepreg at a right angle, and compressing the laminate.

Moreover, an intermediate material in which a good rigidity is attained in two directions can be obtained by laminating a plurality of paper-like products of the present invention or prepregs of paper-like products of the present invention so that their orientation directions intersect at a right angle. A prepreg of this type including paper-like products of the present invention is suitable for obtaining a thin molded plate for which a high dimensional stability is required, for example, a substrate of a printed circuit board. As compared with the case where conventional non-oriented paper is used, a high reinforcing effect can be obtained with a smaller amount of fibers.

Advantages of the paper-like product of the present invention in which the content of staple fibers oriented in a specific direction is at least 50% are as follows.

1. Since the product has a paper-like shape, the product can be used as a thin reinforcement, and since the fibers are oriented, the reinforcing effect is much higher than that of a non-oriented paper reinforcement.

2. The paper-like product of the present invention in which the orientation direction (the above-mentioned specific direction) intersects the longitudinal direction of the paper-like product at a right angle can be easily and continuously laminated and compressed as a 90° reinforcement on a unidirectional prepreg composed of continuous filaments. Accordingly, the paper-like product is economically advantageous as a reinforcing material.

3. A typical 90° reinforcing material for a unidirectional material is a material comprising a component arranged in the longitudinal direction (that is, a warp), such as a thin glass cloth. When this reinforcing material is laminated and compressed on a unidirectional prepreg, separation is caused between the unidirectional prepreg and the glass cloth with the lapse of time because of the stress present in the laminate (contraction of the glass cloth in the warp direction). In contrast, in the paper-like product of the present invention, since the amount of the warp component is very small, the freedom in the warp direction (i.e., the longitudinal direction) is high, and separation as described above is not caused at all.

The method and apparatus for producing a paper-like product of the present invention most preferred as a reinforcement for FRP, that is, a long paper-like product comprising at least 50% of staple fibers oriented in a specific direction which intersects the longitudinal direction of the paper-like product at a right angle will now be described in detail.

In most presently available papers and non-woven fabrics composed of staple fibers, the staple fibers are randomly oriented. As pointed out hereinbefore, random orientation is not preferred for a reinforcement for FRP. Since physical properties are improved if staple fibers are oriented in a specific direction, methods have been proposed for overcoming the above disadvantage by orienting staple fibers in a specific direction. For example, in the field of the wet process, a method is known in which a dispersion of staple fibers is jetted from the inner side of a rotary drum to orient the staple fibers in the circumferential direction of the drum and the resulting web is collected. Since the operation is batchwise in this method, it is technically difficult to obtain a continuous sheet or web according to this method. In the field of the dry process, a method is known in which staple fibers are dropped on an inclined plate having a groove or pin to orient the staple fibers, as shown in Japanese Unexamined Patent Publications (Kokai) No. 57-39272 and No. 57-51856. However, the product has an inferior separability and orientation degree. Accordingly, production of an oriented continuous sheet of staple fibers has not been industrially utilized. Therefore, it is intended in the present invention to provide an oriented continuous paper-like product in which staple fibers which are sufficiently separated and rectified are oriented in a direction substantially orthogonal to the longitudinal direction of the paper-like product. Basically, this can be attained by a method for the production of a paper-like product, which comprises scattering a liquid formed by dispersing stable fibers (hereinafter referred to as "slurry") in the horizontal direction by a centrifugal force and collecting the staple fibers in the paper-like form on a collecting surface moving continuously in the vertical direction. This method can be carried out by using the following apparatus.

Namely, the apparatus for the production of a paper-like product according to the present invention comprises a disk member rotating around the vertical axis, supply means for supplying a slurry onto the disk member, and staple fiber collecting means arranged in close proximity to the periphery of the disk member and moving in the vertical direction.

Figure 3:
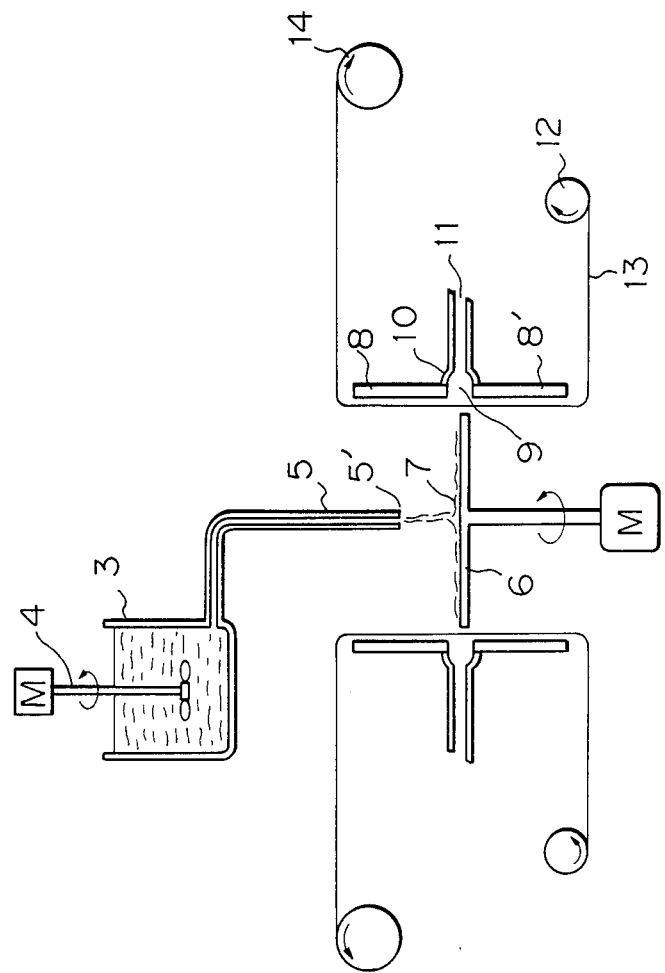
FIG. 3 is a diagram illustrating one embodiment of the method and apparatus for the production of the paper-like product of the present invention.

The structure of this apparatus will now be described in detail with reference to the accompanying drawings. FIG. 3 is a schematic diagram of the apparatus, in which reference numeral 3 represents a staple fiber dispersing vessel, and reference numeral 4 represents a stirring rod having an appropriate stirring vane. A dispersing liquid and staple fibers are supplied to the vessel 3 where the staple fibers are dispersed to form a slurry. Reference numeral 5 represents a feed pipe for feeding a sufficiently dispersed slurry and reference numeral 5' represents a slurry supply nozzle. A slurry supply means is constructed by the feed pipe 5 and slurry supply nozzle 5'. The sectional shape of the slurry supply nozzle 5' is not particularly critical, but to ensure a smooth supply of the slurry, it is preferred that the slurry supply nozzle 5' should have a circular section. Moreover, to promote the orientation of staple fibers in the nozzle by the laminar flow effect, it is preferred that the top end portion of the nozzle 5' be tapered. If this tapered nozzle is used, the separability and orientation degree are further enhanced. Constant rate feeding of the slurry is accomplished by disposing a liquid feed pump midway in the feed pipe 5 or by maintaining a constant liquid level in the dispersing vessel 3 by constantly supplying the slurry into the dispersing vessel 3 at the same rate as the slurry feed rate. In the drawings, reference numeral 6 represents a rotary disk member for scattering the slurry in the horizontal direction, and reference numeral 7 represents staple fibers in the slurry moved toward the periphery of the rotary disk member 6 by rotation of the rotary disk member 6.

Figure 4:
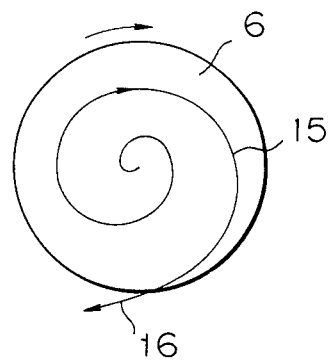
FIG. 4 is a diagram illustrating the movement of a slurry supplied to the rotary disk member of the apparatus shown in FIG. 3.
Figure 5:
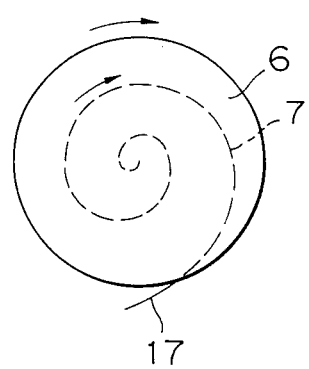
FIG. 5 is a diagram illustrating the movement of staple fibers in the slurry shown in FIG. 4.

The slurry supplied to the center of the rotary disk member 6 (hereinafter referred to as "disk") is moved toward the periphery of the disk by a centrifugal force while drawing a spiral locus as shown in FIGS. 4 and 5, and is scattered beyond the periphery of the disk.

More specifically, referring to FIG. 4, the slurry is moved while drawing a spiral locus as represented by reference numeral 15 and is scattered in the extension direction 16 of the scattering line 15. At this point, as shown in FIG. 5, staple fibers in the slurry are two-dimensionally arranged on the disk 6, are moved while drawing a locus close to the moving course of the slurry, and are similarly scattered beyond the periphery of the disk.

It is preferred that the staple fibers be moved in an as elongated state as possible. More specifically, it is preferred that the residence time of the slurry on the disk be prolonged, although the residence time is influenced by the shape and rotation speed of the disk and the viscosity of slurry. In this case, the laminar flow effect and the slurry rectifying effect can be attained, with the result that the orientation degree of staple fibers can be enhanced.

Ordinarily, the surface of the disk 6 may be smooth. However, in view of the dispersibility and orientability of stable fibers, uniformalization of the scattering of the slurry beyond the periphery of the disk, and the properties of the slurry and staple fibers, various surface configurations may be adopted for the disk. For example, spiral, radial or concentric grooves may be formed on the surface of the disk, or convexities and concavities may be formed on the surface of the disk. Moreover, the upper surface of the disk may be of a concave or convex shape. An appropriate material may be especially selected for the disk.

In FIG. 3, reference numeral 12 represents a feed roller for a collecting member 13 (hereinafter referred to as "screen") for collecting staple fibers scattered to the periphery of the disk 6, and reference numeral 14 represents a winding roller for the screen 13. References 8 and 8' represent a circular pipe having a suction slit 9, which is arranged at the back of the screen 13. The scattered slurry is delivered to the screen 13 moved between the disk 6 and the circular pipe 8, 8' at a right angle with the surface of the disk 6.

Figure 6:
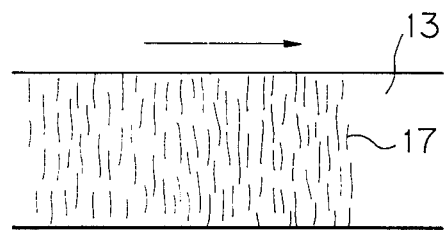
FIG. 6 is a diagram illustrating the orientation state of staple fibers collected on the screen of the apparatus shown in FIG. 3.

The suction slit 9 is opened over the entire area of the circular pipe 8, and the pressure is reduced through a suction chamber 10 and a suction pipe 11. The staple fibers in the slurry delivered to the screen 13 are collected on the screen 13 and the dispersing liquid is separated and removed through the suction slit 9. Accordingly, as shown in FIG. 6, the staple fibers 17 are collected on the screen 13 in such a manner that the staple fibers 17 are oriented perpendicularly (90°) to the longitudinal direction (indicated by an arrow) of the screen 13.

The screen is present over the entire periphery of the disk, and should be moved at a right angle to the surface of the disk (in the vertical direction when the disk is horizontally arranged). For example, a method should be adopted in which the screen coming from the feed roller is first flat and is then transformed into the cylinder having the same curvature as that of the circular pipe by using a bow bar or the like, and the screen coming from the circular pipe is made flat again and is wound. Furthermore, a method may be adopted in which one collecting member is arranged in such a manner that it surrounds the entire periphery of the disk and passages over the entire periphery of the disk, although in the embodiment shown in FIG. 3, two collecting member (screens) are arranged on both sides of the disk so that each screen surrounds a half of the periphery of the disk.

The material of the screen is not particularly critical, in so far as the material is capable of passing staple fibers therethrough. For example, a woven fabric, a knitted fabric, and a non-woven fabric may be used.

The greatest advantage of the above-mentioned preparation method is that while the slurry dropped and supplied onto the rotary disk is scattered by a centrifugal force, separated fibers do not gather together again and this separation is enhanced by the laminar effect and rectifying effect of the slurry on the disk, since the slurry is dropped and supplied at the center of the disk, the fibers are uniformly scattered in the circumferential direction of the disk, with the result that a sheet composed of highly separated fibers and having an excellent uniformity is collected on the screen. Moreover, according to the above-mentioned preparation method, by changing the concentration of staple fibers in the dispersion, the feed rate of the dispersion, and the speed of winding the collecting screen, the basis weight of the sheet deposited on the collecting screen can be changed within a broad range very easily, and even a sheet having a small basis weight, the preparation of which is very difficult according to the conventional technique, can be advantageously prepared. For example, when carbon fibers are used, a sheet having such a basis weight as small as about 3 g/m$^2$ can be obtained. Accordingly, the above-mentioned method of the present invention is very suitable for producing a paper-like product having a basis weight of 3 to 20 g/m$^2$, preferably 5 to 15 g/m$^2$.

Other embodiments of the elements of the above-mentioned apparatus will now be described.

In FIG. 3, the supply opening 5' of the slurry supply means 5 is arranged on the rotation axis of the disk. A modification may be adopted in which the supply opening is formed at the center of the rotation axis of the disk so that the slurry flows out from the center of the disk. This can be regarded as one embodiment of the supply means set forth in claim 9 where the supply opening is arranged on the rotation axis of the disk member.

Supply of the slurry also can be accomplished by the following apparatus.

It has been found that where a dispersion of staple fibers is dropped and supplied onto a rotary disk member, good results can be obtained if the moving speed of the disk at a point of arrival of the slurry at the disk surface is the same as or higher than the slurry supply speed. In this case, the surface speed on the rotating disk is increased in proportion to the diameter of the disk, and in the vicinity of the center of rotation the surface speed is close to zero. Accordingly, if the slurry is supplied to the vicinity of the center of the disk, the speed of the liquid is not substantially influenced by the surface speed of the disk just after the arrival of the liquid at the disk surface, that is, the speed of the liquid consists solely of the speed at which the liquid is expanding, and this slurry speed is much lower than the slurry supply speed. Note, this speed is influenced to some extent by the viscosity of the dispersion. More specifically, the speed of the slurry is once reduced at the center of the disk surface and the slurry is once at a standstill. Then the speed is increased, and the slurry is moved by a centrifugal force generated by the rotation of the disk. At this point, the staple fibers in the slurry are disturbed and entangled with one another, and the fibers scattered in a condition wherein this disturbed orientation is not corrected. Therefore, it is preferred that the speed of the slurry be always the same as the supply speed or be faster than the supply speed. For this purpose, the slurry is supplied concentrically or dividedly at a position where the surface speed of the disk is the same as or higher than the slurry supply speed and is scattered over the periphery of the disk, and the staple fibers are collected on the collecting screen which moves around the disk in the direction intersecting the moving direction of the disk at a right angle. By adoption of this feature, a continuous sheet can be obtained in which staple fibers are laterally oriented, and disturbed orientation, the defect of the conventional technique, is substantially obviated. More specifically, to obtain an optimum orientation of staple fibers, it is preferred that the slurry be supplied on the rotary disk concentrically with respect to the center of the disk at a point where the surface speed of the rotary disk is the same as or higher than the slurry supply speed. Where the required orientation degree is relatively low, the slurry may be supplied on the disk surface at a point where the surface speed of the disk is lower than the slurry supply speed. This method of the present invention is characterized in that, in order to increase the orientation degree of staple fibers, the slurry is supplied in the cylindrical or semi-cylindrical form on the surface of the rotary disk at a point separate from the center of rotation of the disk. Accordingly, the term "concentric" as used herein and in the appended claims means that the slurry is supplied on at least one circle concentric with the center of rotation of the disk, and whether the slurry is supplied continuously or discontinuously, that is, dividly, the amount scattered of the slurry is not irregular but uniform in the circumferential direction.

Figure 7A:
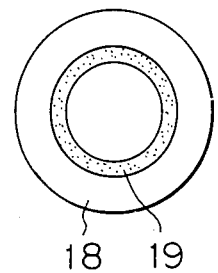
FIGS. 7a, 7b, and 7c are diagrams illustrating the states of the slurry supplied on the rotary disk member of the apparatus shown in FIG. 3.
Figure 7B:
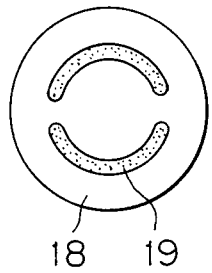
Figure 7C:
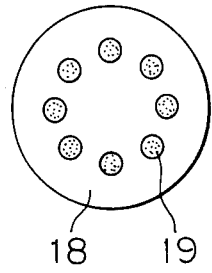

FIGS. 7a, 7b and 7c are plane views showing the states where the slurry is supplied on the disk surface at a position concentric with the center of rotation of the disk. FIG. 7a shows the state where the slurry is supplied in the form of a cylinder and FIGS. 7b and 7c show the state where the slurry is dividedly supplied. In each of FIGS. 7a, 7b and 7c, reference numeral 18 represents the disk and reference numeral 9 represents the section of the supplied slurry. The sectional shape may be appropriately selected, but cylindrical supply is ordinarily preferred because the slurry is uniformly scattered along the circumferential direction of the disk and the basis weight is uniformalized in the resulting sheet.

Figure 8A:
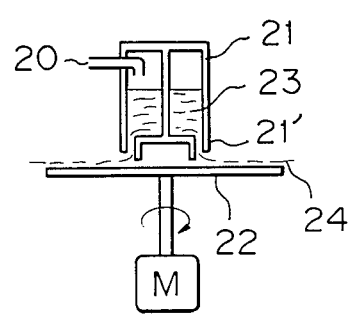
FIGS. 8a and 8b are diagrams illustrating modes of supplying a slurry on the rotary disk member of the apparatus for the production of the paper-like product of the present invention.
Figure 8B:
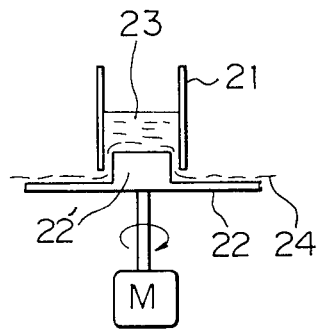

FIGS. 8a and 8b show models in which the section of the supplied slurry is cylindrical and the opening for supplying the cylindrical slurry is disposed at a right angle to the surface of the disk.

FIG. 8a shows an example in which the supply opening is a cylindrical slit. In FIG. 8a, reference numeral 20 represents a feed pipe for feeding a dispersion of staple fibers, reference numeral 21 represents a supply tank having a cylindrical supply opening, and reference numeral 27 represents a rotary disk member. In this case, the slurry 23 is supplied in the cylindrical form from the supply opening 21 at a right angle to the surface of the disk 27. If the diameter of the slurry cylinder is adjusted so that the slurry is dropped on the disk surface at a point where the surface speed of the disk is equal to or higher than the slurry supply speed, staple fibers 24 are passed through the supply opening and the disk surface and scattered beyond the periphery of the disk without intermediate reduction of the speed in the state where the staple fibers are oriented along the direction of the flow of the slurry. FIG. 8b shows an example in which a columnar projection 22' is formed in the central portion of the disk 22 and the projection 22' is rotated simultaneously with the disk. Reference numeral 24 represents a supply tank having an inner diameter larger than the diameter of the columnar projection 22', and the slurry 23 is passed through a clearance between the columnar projection 22' and the supply tank 24 and scattered beyond the periphery of the disk.

In FIGS. 8a and 8b, the opening for the cylindrical supply is disposed at a right angle to the surface of the disk. However, an end-broadened cone-shaped supply opening having a certain inclination may be used according to need. The disk member may have a groove on the surface or may have a section having an inclination or curvature with the horizontal plane.

By using the above-mentioned slurry supply means, intermediate reduction of the flow speed of the slurry is prevented and the slurry speed is always maintained in the accelerated state during flowing of the slurry on the disk surface, and hence, staple fibers are collected on the screen in the state where the fibers are highly separated and a good orientation is maintained along the flowing direction of the slurry. Accordingly, there can be obtained a sheet in which staple fibers are highly separated and the disturbance of orientation is greatly controlled.

Figure 9:
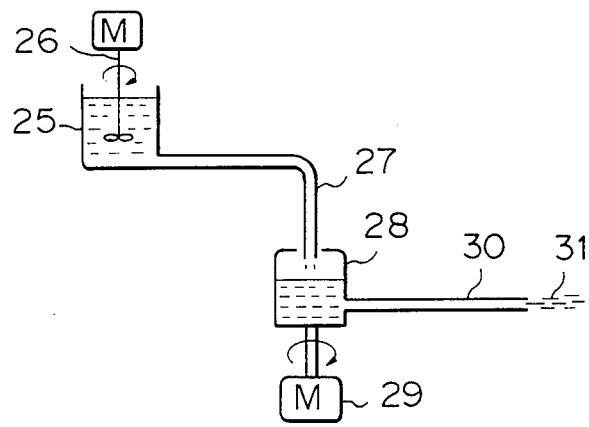
FIG. 9 is a diagram illustrating another embodiment of the apparatus for the production of the paper-like product of the present invention.
Figure 10:
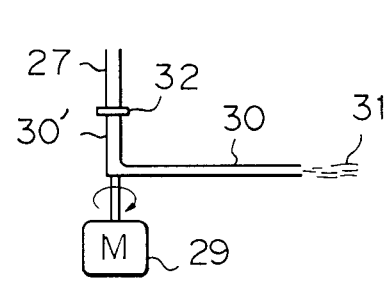
FIG. 10 is a diagram illustrating still another embodiment of the apparatus for the production of the paper-like product of the present invention.
Figure 11:
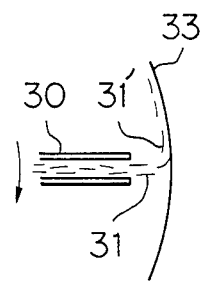
FIG. 11 is a diagram illustrating the staple fiber-collecting zone in the apparatuses shown in FIGS. 10 and 11.

The devices shown in FIGS. 9, 10, and 11 can be used for scattering the slurry in the horizontal direction by a centrifugal force instead of the above-mentioned disk.

FIG. 9 is a model diagram showing an embodiment in which the slurry is temporarily halted in the flow system of the slurry and is then fed out. In FIG. 9, reference numeral 25 represents a vessel for preparing a dispersion of staple fibers, and reference numeral 26 represents a stirring rod for stirring the dispersion. The dispersion of staple fibers prepared in the vessel 25 is supplied through a supply pipe 27 into a small vessel 28 having an injection nozzle 30, the top end of which is disposed in the longitudinal direction. A vessel-rotating motor 29 is attached to the lower side of the central axis of the small vessel 28, a centrifugal force is generated by rotation, and the slurry is caused to flow out at a high speed in the axial direction of the nozzle. The staple fibers 31 are caused to simultaneously flow out in the state where the fibers are oriented in the axial direction of the nozzle. When this state is seen from above, the slurry is continuously jetted out over 360° with the rotation axis being the center beyond the circular locus drawn by the top end of the nozzle.

FIG. 10 is a sectional view showing an embodiment in which the supplied dispersion of staple fibers is continuously jetted out. In FIG. 10 reference numeral 27 represents a feed pipe having the top end connected to a jet nozzle 30 horizontally directed through a joint 32, and the connecting portion 30' of the nozzles has a union structure capable of axial rotation. A rotating motor 29 is attached to the lower side of the central axis of the connecting portion 30' of the nozzle 30, and the slurry supplied by rotation is continuously jetted out beyond the circular locus of the top end of the nozzle as in the embodiment shown in FIG. 9.

FIG. 11 shows the collection of staple fibers contained in the dispersion of staple fibers, and is a plane view diagram illustrating the state of the collected staple fibers. The fibers 31 jetted out from the jet nozzle 30 are scattered through the above-mentioned flow system and are oriented in the axial direction of the nozzle by the laminar flow effect of the slurry. Reference numeral 33 represents a cylindrical fiber-collecting member disposed outside the circular locus of the top end of the nozzle, and the jetted fibers are collected on the collecting member in the state where the fibers are oriented in the circumferential direction of the collecting member as indicated by reference numeral 31'.

In connection with the structure of the jet nozzle, it is preferred that the top end portion of the nozzle be disposed in the horizontal direction, but the top end portion of the nozzle may be directed upward or downward according to need and the flow passage to the top end portion may be inclined or curved relative to the horizontal plane according to the intended degree of orientation of the fibers. The sectional shape of the nozzle is not particularly critical, but a tapered nozzle having a slit as an outlet hole is ordinarily preferred. The number of nozzles is determined according to the intended flow amount, and a large flow amount can be easily obtained by appropriately increasing the number of nozzles.

Means for scattering the slurry in the horizontal direction has been described in detail with reference to FIGS. 3, 7, 8, 9, and 10. The preparation method of the present invention can also be carried out by using the apparatus described below.

Figure 12:
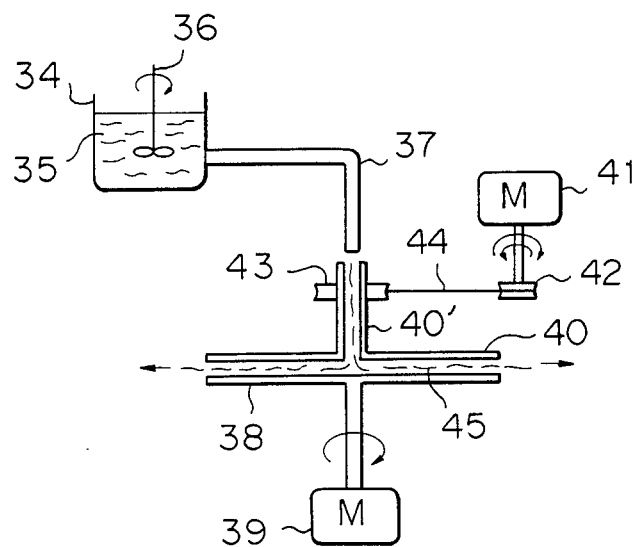
FIG. 12 is a diagram illustrating a still another embodiment of the apparatus for the production of the paper-like product of the present invention.

In the preparation apparatus shown in FIG. 12, the slurry is supplied to the vicinity of the rotation axis of two opposed disks having an appropriate clearance therebetween. In FIG. 12, reference numeral 38 represents one disk member connected to a rotating motor 39 and reference numeral 40 represents another disk member having a slurry supply tube 40' formed in the central portion thereof. Rotation of this disk 40 is effected by driving a pulley 43 attached to the slurry supply tube 40' from a pulley 42 connected to a motor 41 through a belt 44. Reference numeral 34 represents a tank for preparing a dispersion 35 of the staple fibers, and reference numeral 36 represents a rotation shaft provided with a stirring vane. The slurry prepared in the tank is fed into the slurry supply tube 40' through a feed pipe 37 and is moved between the confronting disks 38 and 40 in the radial direction of the disks by a centrifugal force generated by rotation of the disks, thus scattering the slurry beyond the peripheries of the disks. At this point, staple fibers 45 in the slurry are moved and scattered beyond the peripheries of the disks in the state oriented in the flow direction of the slurry by the flow speed gradient effect of the slurry.

Figure 13:
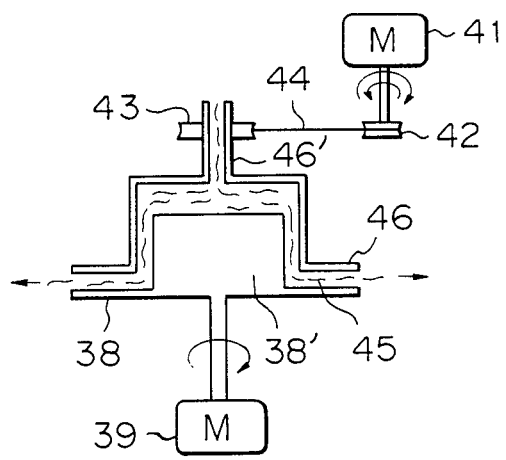
FIG. 13 is a diagram illustrating a still further embodiment of the apparatus for the production of the paper-like product of the present invention.

In the preparation apparatus illustrated in FIG. 13, the slurry is supplied in the cylindrical form at a position concentric with the rotation center of each disk. In FIG. 13, reference numeral 38 represents one disk member having a columnar projection 38' formed in the central part of the disk. This disk 38 is connected to a rotating motor 39. Reference numeral 46 represents another disk member having a concave central portion and a slurry supply tube 46' formed in the central portion thereof. Rotation of this disk 46 is effected by driving a pulley 43 attached to the liquid supply passage from a supply 43 attached to a motor 41 through a belt 44. Also in this embodiment, as in the embodiment shown in FIG. 12, the slurry flows between the confronting disks 38, 46, is scattered beyond the peripheries of the disks, and staple fibers 45 in the slurry are scattered beyond the peripheries of the disks in the state oriented in the flow direction of the slurry. The sectional shapes of the confronting disks are not limited to those shown in FIG. 13, in that the disks may have a vertical section or have an appropriate inclination or curvature to the horizontal plane. Moreover, appropriate grooves may be formed on the surfaces of the disks. The outer diameters of the disks may be the same or different. Principally, the same rotation direction and rotation speed are adopted for the confronting disks, but different rotation directions and speeds may be adopted for the disks according to need.

In the foregoing apparatuses, various advantages are attained because of the feature that the slurry is caused to flow between the two confronting disks. For example, since the sectional area of the flowing slurry is kept constant, the amount of the slurry scattered in the circumferential direction of the disks is uniformalized, and in the obtained sheet composed of staple fibers collected on the collecting member, the basis weight is even, and the sheet is homogeneous in quality. Furthermore, the occurrence of an abnormal turbulent flow or pulsating flow in the slurry is controlled, and disturbance of orientation or entanglement is controlled in the staple fibers. The flow amount of the slurry is keep constant and stable for a long time. Accordingly, the appearance of defects in the obtained sheet is greatly controlled and a high-quality sheet can be obtained in a high yield at a high efficiency. Moreover, when a viscous dispersant is used, a speed gradient is effectively obtained during the flowing movement of the slurry. Accordingly, in this case, the effects of separating and orienting the staple fibers are enhanced, and a highly oriented, highly separated, homogeneous continuous sheet can be advantageously obtained.

The slurry used in the above-mentioned methods for obtaining paper-like products comprising staple fibers oriented in a specific direction, which methods are typically carried out by using the above-mentioned apparatuses, will now be described.

A thickening agent is incorporated into the slurry to improve the dispersibility of staple fibers contained in the slurry. When water is used as the solvent of the slurry, a water-soluble polymeric material is used as the thickening agent. For example, there may be used water-soluble thickening agents such as sodium alginate, carboxymethyl cellulose, sodium polyacrylate, polyacrylamide, other water-soluble acrylic resins, polyvinyl alcohol, polyethylene oxide, polyvinyl pyrrolidone, water-soluble nylons, glycerol, and water glass. A polymeric substance having a high thickening effect at a low concentration is preferred.

It is technically possible to form a slurry by using a solvent other than water. However, water is most preferred from the economical viewpoint.

Staple fibers are charged as the reinforcing fibers into a dispersion having an appropriate viscosity given by a thickening agent as described above, and the staple fibers are dispersed by a stirring action to form a slurry. Any staple fibers capable of flowing through the flow passage can be used in the preparation methods and apparatuses of the present invention. For example, there can be mentioned carbon fibers, glass fibers, aramide fibers, steel fibers, alumina fibers, asbestos fibers, and whiskers.

From the results of experiments, it was confirmed that in view of the paper-forming operation, the fiber length is preferably 3 to 25 mm. With a fiber length of up to about 25 mm, the paper-forming operation can be performed stably, since special attention should be paid to the flow system and stirring system when the fiber length is larger than 25 mm. If fibers having a length smaller than 3 mm, for example, whiskers, are used, a special collecting screen should be particularly selected and used.

It has been confirmed that when FRP is prepared by using the paper-like product of the present invention containing at least 50% of staple fibers oriented in a specific direction, the obtained composite material having well-balanced properties can be obtained if the fiber length is at least 8 mm in the case where the fiber diameter is 5 to 20 μm.

We claim:

1. A paper-like product composed of (a) staple fibers oriented substantially in a direction orthogonal to the longitudinal direction of the paper-like product and (b) binder fibers which are staple fibers having portions parallel and perpendicular to the oriented staple fibers (a); said staple fibers (a) having an orientation degree, expressed by the following formula:

$$\text{orientation degree (\%)} = \frac{\text{number of staple fibers oriented within } \pm 5° \text{ to direction orthogonal to longitudinal direction of paper-like product}}{\text{total number of staple fibers in paper-like product}} \times 100$$

of at least 50%, and the proportioin of the binder fibers (b) being at least about 1.5% by weight based on the total fibers.

2. A paper-like product as set forth in claim 1, wherein the staple fibers (a) have an orientation degree of at least 60%.

3. A paper-like product as set forth in claim 1, wherein the staple fibers (a) have an orientation degree of at least 80%.

4. A paper-like product as set forth in claim 1, wherein some staple fibers (a) are oriented in a direction perpendicular to said direction orthogonal to the longitudinal direction of the paper-like product.

5. A paper-like product as set forth in claim 1 wherein the recited orientation degree of staple fibers (a) is conferred upon it during its manufacture.

6. A prepreg formed by impregnating a paper-like product composed of (a) staple fibers oriented substantially in a direction orthogonal to the longitudinal direction of the paper-like product and (b) binder fibers which are staple fibers having portions parallel and perpendicular to the oriented staple fibers (a), with a matrix resin; said staple fibers (a) having an orientation degree, expressed by the following formula:

$$\text{orientation degree (\%)} = \frac{\text{number of staple fibers oriented within } \pm 5° \text{ to direction orthogonal to longitudinal direction of paper-like product}}{\text{total number of staple fibers in paper-like product}} \times 100$$

of at least 50%, and the proportion of the binder fibers (b) being at least about 1.5% by weight based on the total fibers.

7. A prepreg as set forth in claim 6, wherein the staple fibers (a) have an orientation degree of at least 60%.

8. A prepreg as set forth in claim 6, wherein the staple fibers (a) have an orientation degree of at least 80%.

9. A prepreg as set forth in claim 6 wherein the recited orientation degree of staple fibers (a) is conferred upon the paper-like product during its manufacture.

10. A composite prepreg formed by laminating a plurality of prepregs formed by impregnating a paper-like product composed of (a) staple fibers oriented substantially in a direction orthogonal to the longitudinal direction of the paper-like product and (b) binder fibers which are staple fibers having portions parallel and perpendicular to the oriented staple fibers (a), with a resin matrix, so that the orientation directions of the staple fibers (a) in the prepregs intersect one another; said staple fibers (a) having an orientation degree, expressed by the following formula:

$$\text{orientation degree (\%)} = \frac{\text{number of staple fibers oriented within } \pm 5° \text{ to direction orthogonal to longitudinal direction of paper-like product}}{\text{total number of staple fibers in paper-like product}} \times 100$$

of at least 50%, and the proportion of the binder fibers (b) being at least about 1.5% by weight based on the total fibers.

11. A composite prepreg as set forth in claim 10, wherein the staple fibers (a) have an orientation degree of at least 60%.

12. A composite prepreg as set forth in claim 10, wherein the staple fibers (a) have an orientation degree of at least 80%.

13. A composite prepreg as set forth in claim 10 wherein the recited orientation degree of staple fibers (a) is conferred upon the paper-like product during its manufacture.

14. A composite prepreg formed by laminating a prepreg formed by impregnating a paper-like product composed of (a) staple fibers oriented in a direction orthogonal to the longitudinal direction of the paper-like product and (b) binder fibers which are staple fibers having portions parallel and perpendicular to the oriented staple fibers (a), with a resin matrix, with a prepreg composed of continuous filaments oriented substantially in a certain specific direction, so that the orientation direction of the staple fibers (a) and the orientation direction of the continuous filaments intersect each other; said staple fibers (a) having an orientation degree, expressed by the following formula:

$$\text{orientation degree (\%)} = \frac{\text{number of staple fibers oriented within } \pm 5° \text{ to direction orthogonal to longitudinal direction of paper-like product}}{\text{total number of staple fibers in paper-like product}} \times 100$$

of at least 50%, and the proportion of the binder fibers (b) being at least about 1.5% by weight based on the total fibers.

15. A composite prepreg as set forth in claim 14, wherein the staple fibers (a) have an orientation degree of at least 60%.

16. A composite prepreg as set forth in claim 14, wherein the staple fibers (a) have an orientation degree of at least 80%.

17. A composite prepreg as set forth in claim 14 wherein the recited orientation degree of staple fibers (a) is conferred upon the paper-like product during its manufacture.

* * * * *